US005672435A

United States Patent [19]
Born et al.

[11] Patent Number: 5,672,435
[45] Date of Patent: Sep. 30, 1997

[54] HARD DISK DRIVE COMPONENTS AND METHODS OF MAKING SAME

[75] Inventors: David W. Born; Uday V. Deshmukh; Timothy G. Fawcett; Richard T. Fox; Kevin J. Nilsen; Aleksander J. Pyzik, all of Midland, Mich.

[73] Assignee: The Dow Chemical Company, Midland, Mich.

[21] Appl. No.: 496,797

[22] Filed: Jun. 29, 1995

Related U.S. Application Data

[63] Continuation-in-part of Ser. No. 354,185, Dec. 12, 1994, abandoned.

[51] Int. Cl.$^6$ .................................................. B22F 3/26
[52] U.S. Cl. ............... 428/539.5; 428/548; 428/551; 428/552; 428/553; 428/554; 501/87; 501/93; 501/96
[58] Field of Search .................... 501/87, 93, 96; 428/539.5, 548, 551, 552, 553, 554, 564, 565

[56] References Cited

U.S. PATENT DOCUMENTS

| | | | |
|---|---|---|---|
| 4,605,440 | 8/1986 | Halverson et al. | 501/87 |
| 4,702,770 | 10/1987 | Ryzik et al. | 75/236 |
| 4,704,250 | 11/1987 | Cline et al. | 428/539.5 |
| 4,718,941 | 1/1988 | Halverson et al. | 75/236 |
| 4,726,842 | 2/1988 | Reeve et al. | 428/552 |
| 4,834,938 | 5/1989 | Pyzik et al. | 419/6 |
| 4,885,130 | 12/1989 | Claar et al. | 419/12 |
| 4,949,194 | 8/1990 | MacPherson et al. | 360/104 |
| 4,961,778 | 10/1990 | Ryzik et al. | 75/230 |
| 4,988,645 | 1/1991 | Holt et al. | 501/96 |
| 5,039,633 | 8/1991 | Ryzik et al. | 501/93 |
| 5,149,595 | 9/1992 | Kojo et al. | 428/552 |
| 5,153,044 | 10/1992 | Chen et al. | 428/64 |
| 5,168,184 | 12/1992 | Umehara et al. | 310/15 |
| 5,168,185 | 12/1992 | Umehara et al. | 310/15 |
| 5,187,625 | 2/1993 | Blaeser et al. | 360/104 |
| 5,227,345 | 7/1993 | Howard et al. | 428/565 |
| 5,260,847 | 11/1993 | Basehore et al. | 360/106 |
| 5,296,417 | 3/1994 | Claar et al. | 501/87 |
| 5,298,468 | 3/1994 | Pyzik | 501/87 |
| 5,308,422 | 5/1994 | Askay et al. | 501/89 |
| 5,348,806 | 9/1994 | Kojo et al. | 428/552 |
| 5,521,016 | 5/1996 | Pyzik et al. | 428/552 |

FOREIGN PATENT DOCUMENTS

| | | |
|---|---|---|
| 0322336 | 5/1993 | European Pat. Off. . |
| 0299905 | 6/1993 | European Pat. Off. . |
| 0378504 | 8/1994 | European Pat. Off. . |

OTHER PUBLICATIONS

*Mechanical Engineering*, "Ceramic–Metal Composites: Bulletproof Strength", pp. 46–51, Jul. 1990, Ashley.

Primary Examiner—Mark L. Bell
Assistant Examiner—Louis M. Troilo

[57] ABSTRACT

Hard disk drive components, such as, sliders, load beams, support arms, actuators, actuator bearings, spacers, clamps, spindles, ball bearings, thrust bearings, journal bearings, base plates, housings, and covers, formed of a multi-phase ceramic-based material. One method of making the hard disk drive components includes (a) forming a porous body of ceramic; (b) infiltrating a liquid into the pores of the ceramic body; (c) solidifying the infiltrated liquid; and (d) machining the metal-infiltrated ceramic body to form the hard disk drive component.

15 Claims, 2 Drawing Sheets

HARD DISK DRIVE COMPONENTS AND METHODS OF MAKING SAME

This application is a continuation-in-part of application U.S. Ser. No. 08/354,185 filed on Dec. 12, 1994 now abandoned.

BACKGROUND OF THE INVENTION

1. Field of the Invention

This invention relates to hard disk drive components and methods of making same and, more particularly, to hard disk drive components formed of multi-phase ceramic-based materials and methods of making same.

2. Background of the Invention

Current trends in the computer industry are toward lighter, smaller, more reliable computers with the capability of higher data storage and faster storage and retrieval of information. To this end, computer components, such as those for hard disk drives, are preferably lighter, smaller, more reliable, and able to perform at the faster speeds desired. To meet these qualifications, the computer components and the conventional materials forming those components will require improvements in physical and performance properties.

Computer components for hard disk drives include devices such as sliders, load beams, support arms, actuators, actuator bearings, spacers, clamps, spindles, ball bearings, thrust bearings, journal bearings, base plates, housings, and covers. A slider is a small pad which comes into a very close proximity to the hard disk typically carries a read/write head for reading and writing information on the disk itself. These read/write heads are transducers which read and write data onto the magnetic hard disk. Each slider in a disk drive is attached to a suspension assembly, which typically includes a flexural element attached to a load beam. Varying or uncontrolled slider/disk gap clearance can degrade the read/write signal reliability, which reduces the quality of the computer. Thus, the design and materials used in these components are quite important.

One or two load beams are typically positioned at the end of a support arm. Two or more support arms, integral with or attached to a portion of the actuator, pivot about a spindle axis, typically coupled with the aid of an actuator bearing. In some cases, each support arm is a separate component and several such support arms, which include the pivot surface, can be stacked together with spacers between the individual support arms, forming an arm assembly. As one can imagine, the design and materials of these drive components are critical considerations, as it is very important to minimize vibration during computer operation.

In most drive designs, the hard disks themselves are coupled to a spindle via clamps. Several disks can be attached to one spindle which rotates and, thus, spins the disks. The rotation of this spindle requires that bearings be used. Alternatively, the spindle may be stationary, with the disks coupled to the spindle with bearings which allow free rotation. The internal components of the hard disk drive are usually supported on a base plate, which is often a portion of the housing, and covered with a housing and cover.

Alternative materials for the internal components with decreased density and increased specific stiffness can lead to performance improvements over traditional drives which employ conventional materials. Materials having lower density would result in lighter overall components allowing faster acceleration and physical positioning (i.e., faster reading and writing of data). Materials having higher specific stiffness typically result in components with higher resonance frequencies which can allow faster and more accurate access of the data on the hard disks during use.

Often, it is not a single physical property which is of importance, but rather it is important to excel in a combination of properties. For instance, it is desirable for high stiffness to be combined with high toughness, and/or high hardness to be combined with high strength, and/or high stiffness combined with high damping capability.

Furthermore, it is desirable to have the various computer components formed of the same material to improve dimensional stability and precision of data acquisition. A disk drive having the critical components formed from the same material would be less susceptible to thermal track shift. Other potential advantages for improved and/or compatible disk drive components could include reduced vibration, higher frequencies at which vibration occurs with lower amplitudes, improved bearing runout, faster head settling, and lower wear. These improvements could, in turn, result in reduced flying heights and narrower tracks. Narrower tracks increase areal data density.

Conventional materials which have been used for the various components were typically metals or metal alloys, specifically, aluminum, magnesium, stainless steel, and beryllium-copper. However, these metals are generally characterized by having low hardness, low wear resistance, and low specific stiffness, all undesirable properties. In an effort to overcome these undesirable properties, some have attempted certain ceramic materials, as follows.

For example, U.S. Pat. No. 4,949,194 discloses support arms and support arm assemblies formed of ceramic materials such as alumina or silicon carbide. These ceramic materials are conventionally preformed into the desired shape, then densified by sintering. Although these ceramic materials offer improvements over the conventional metals, they are far from ideal. For instance, alumina and silicon carbide undergo large dimensional changes from the preformed state to the densified state, typically undergoing 18–20% linear shrinkage, depending upon solids volume fraction in the preformed state and final sintered density. The large dimensional change makes it difficult to meet component shape and dimension requirements, if attempted to form to net shape. In addition, alumina and silicon carbide are difficult to machine to the desired dimensions and surface tolerances because of their high hardness and low fracture toughness.

Furthermore, alumina and silicon carbide have low electric conductivity and may result in electrostatic charges which are not easily discharged. Therefore, data destruction due to a build-up of charges can occur.

Consequently, it is the object of this invention to put forth new component materials, and the methods of making same, in order to overcome the problems while enhancing their performance.

SUMMARY OF THE INVENTION

In one aspect, the present invention is a hard disk drive component comprising a device, such as a slider, a load beam, a support arm, an actuator, an actuator bearing, a spacer, a clamp, a spindle, a ball bearing, a thrust bearing, a journal bearing, a base plate, a housing, and a cover, formed of a multi-phase ceramic-based material.

The multi-phase ceramic-based material is a material consisting of at least two phases in which at least one is crystalline ceramic. In a first embodiment, the multi-phase ceramic-based material has free metal as at least one of the phases. When the multi-phase material of the present invention is made from a ceramic-metal combination and a portion of the metal is unreacted within the matrix, then there is free metal left. In a second embodiment, the multi-phase ceramic-based material has at least one phase which is amorphous, such as when a glass or glassy phase is incorporated into the matrix. In a third embodiment, the multi-phase ceramic-based material has at least three phases, and all of the phases of the multi-phase ceramic-based material are crystalline ceramic.

In another aspect, the invention is a method for making hard disk drive components. The method includes (a) forming a porous body of a ceramic; (b) infiltrating a liquid into the pores of the ceramic body; (c) solidifying the infiltrated liquid, and, if necessary, (d) machining the infiltrated ceramic body to form the hard disk drive component. The porous body may be formed by a technique selected from the group consisting of slip casting, tape casting, dry pressing, and injection molding, although any other particulate processing technique may be used as well. Preferably, the liquid is infiltrated into the pores of the ceramic body until the infiltrated ceramic body is substantially dense with the ceramic body undergoing less than about a 2% linear shrinkage upon densification.

Most preferably, the porous body is formed of boron carbide having a porosity of from about 10 to about 75%. Preferably, the liquid is a liquid phase of metal or glass. Preferably, the metal is aluminum.

DETAILED DESCRIPTION OF THE INVENTION

One aspect of the present invention is a hard disk drive component comprising a non-disk device, such as, a slider, a load beam, a support arm, an actuator, an actuator bearing, a spacer, a clamp, a spindle, a ball bearing, a thrust bearing, a journal bearing, a housing, a base plate, a cover, formed of a multi-phase ceramic-based material. The term "non-disk" is used to indicate that the components of the present invention do not include disk substrates used to make the hard disks.

Figure 1:
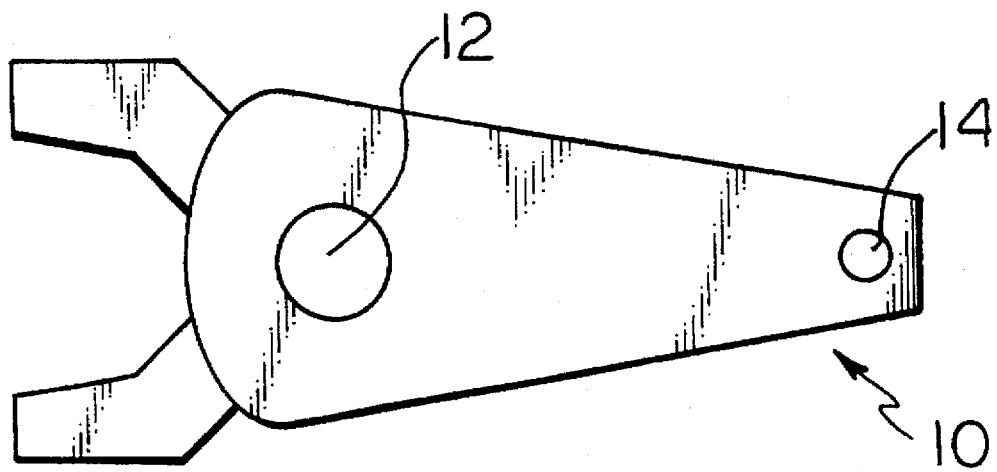
FIG. 1 is a top view of an actuator/support assembly for a hard disk drive.

FIGS. 1–4 are provided for a better understanding of the various hard disk drive components. Actual components in practice may vary in geometrical design from the designs shown in the figures. FIG. 1 is a top view of a typical actuator support assembly 10 having hole 12 for insertion of a shaft, about which rotation can occur, and hole 14 for assisting in mounting a suspension assembly thereon.

Figure 2:
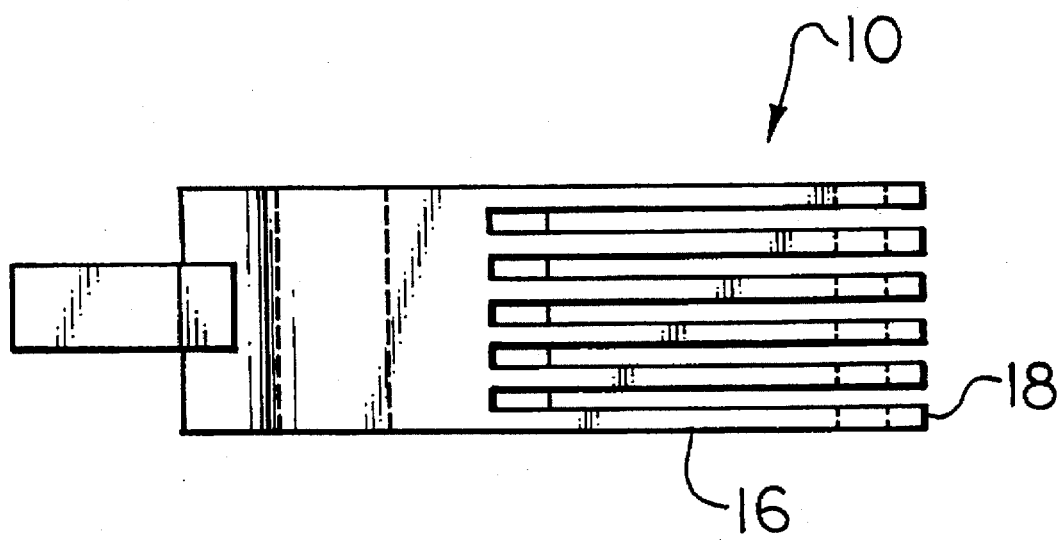
FIG. 2 is a side view of the actuator/support assembly shown in FIG. 1.

FIG. 2 is a side view of actuator support assembly 10 which has six support arms 16 thereon, the support arms each having an arm tip 18.

Figure 3:
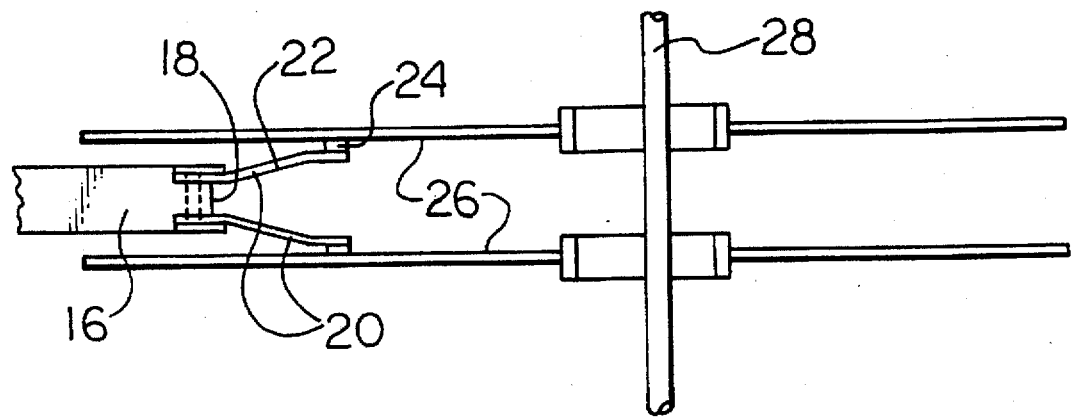
FIG. 3 is a side view of suspension assemblies with sliders shown in position with hard disks of a hard disk drive.

FIG. 3 is a side view of suspension assemblies 20 connected near arm tip 18 of one of the support arms 16 shown in FIG. 2. Each suspension assembly 20 includes load beam 22 and slider 24. As can be seen, each slider 24 hovers above or below a hard disk 26 and, because of its frequent movement and occasional contact along the hard disk, each slider 24 requires good wear-resistance properties. Hard disks 26 are rotatably mounted on spindle 28.

Figure 4:
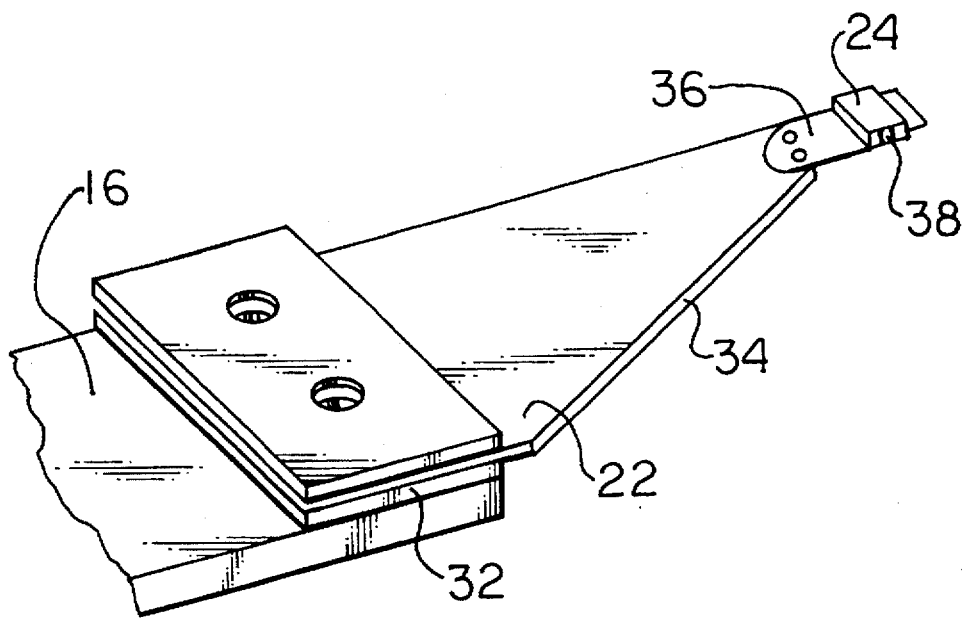
FIG. 4 is a perspective view of the end of a suspension assembly showing some typical components in detail.

FIG. 4 is a perspective view of the end of support arm 16 showing mounting plate 32 which can be used to mount load beam 22 to support arm 16. An important characteristic of load beam 22 is its compliance, which is an inverse function of its stiffness, as it needs to flex without breaking, yet still remain rigid enough to resist vibration during use. Load beam 22 can have a stiffening rail 34 attached on one side at the underside thereof. Another stiffening rail (not shown) is typically attached on the other side of the load beam 22, opposite stiffening rail 34. The stiffening rails are present to stiffen the load beam in order to resist induced vibration. Load beam 22 must also maintain a downward (or upward, as appropriate) force on the slider during operation. Mounted at the end of load beam 22 is flexure element 36. Attached to the flexure element 36 is slider 24 having read/write head 38 thereon.

During use of the computer and reading of or writing onto the hard disks 26, actuator/support assembly 10 rotates on a spindle (not shown) in hole 12 and a hard disk 26 rotates on spindle 28 so that a read/write head can access the correct portion of the hard disk 26 to either read or write on the hard disk.

As mentioned, the devices, such as the sliders, the load beams, the support arms, the actuators, the actuator bearings, the spacers, the clamps, the ball bearings, the thrust bearings, the journal bearings, the base plates, the housings, and the covers, are formed of a multi-phase ceramic-based material. The multi-phase ceramic-based material has at least two phases wherein at least one phase is crystalline ceramic. Preferably, the multiple phases are present in an amount of at least 5 volume percent based on the overall volume of the multi-phase ceramic-based material. In one embodiment, at least one phase of the multi-phase ceramic-based material is free metal. In a second embodiment, at least one phase of multi-phase ceramic-based material is amorphous. In a third embodiment, the multi-phase ceramic-based material has at least three phases and all the phases of the multi-phase ceramic-based material are crystalline. A free metal phase may or may not be present in the second and third embodiments.

Depending on the application, it is preferred that the composite material have a combination of the following properties: a specific stiffness greater than about $5.1 \times 10^6$ m, an electrical resistivity of less than about 10–3 ohm-cm, a fracture toughness above 4 MPa-m$^{1/2}$, and a hardness above 700 Kg/mm$^2$.

The multi-phase ceramic-based material may be a multi-phase ceramic-ceramic composite material or a multi-phase ceramic-metal composite material.

Multi-phase Ceramic-Ceramic Composite Material

One way of forming the ceramic-ceramic composite material is from a combination of a first ceramic and a second ceramic, the first and second ceramics each independently selected from the group consisting of borides, oxides, carbides, nitrides, silicides, and combinations thereof. Examples of ceramic composite materials include combinations of ceramics such as borocarbides, oxynitrides, oxycarbides, and carbonitrides. More than two ceramics may be used to form the ceramic-ceramic composite material, such as carboxynitrides, etc. In this embodiment, the constituent ceramic phases may remain in the densified product in the same form as they were previously introduced, e.g., $Al_2O_3$—SiC, $TiB_2$—SiC, etc.

The first and second ceramics may include a bonded metal which may be selected from the group consisting of boron, silicon, magnesium, aluminum, titanium, vanadium, chromium, iron, copper, nickel, cobalt, tantalum, tungsten, molybdenum, zirconium, niobium, and alloys thereof.

Specific examples of suitable combinations of a first and second ceramic, wherein one ceramic is an amorphous phase such as glasses and glassy phases, include: $B_4C$/glass, SiC/glass, AlN/glass, $TiB_2$/glass, TiC/glass, $Al_2O_3$/glass, $SiB_x$/glass, TiN/glass, $ZrB_2$/glass, ZrC/glass, $AlB_{12}$/glass, $Si_3N_4$/glass, MgO/glass, and $ZrO_2$/glass. Glass is included as an exemplary ceramic as it contains a substantial amount of the oxide $SiO_2$. The use of the subscript "x" represents that the compound can have a varying stoichiometry. SiA-lON is also an exemplary multi-phase ceramic-ceramic composite material suitable for the present invention. SiA-lON is known in the art to be formed from silicon-containing compounds, aluminum-containing compounds, oxygen and nitrogen. More than one crystalline ceramic material may also be used with an amorphous or glassy phase.

Multi-phase Ceramic-Metal Composite Material

Multi-phase ceramic-metal composite materials useful in the present invention may be made from a combination of crystalline ceramic powder and a metal, the metal being selected from the group consisting of silicon, magnesium, aluminum, titanium, vanadium, chromium, iron, copper, nickel, cobalt, tantalum, tungsten, molybdenum, zirconium, niobium, and mixtures and alloys thereof. The metal may or may not be reactive with the ceramic powder at elevated temperatures, e.g., at melt temperatures of the metal and higher. The ceramic powder may be selected from the group consisting of borides, oxides, carbides, nitrides, silicides, and mixtures and combinations thereof. Examples of combinations of ceramics include borocarbides, oxynitrides, oxycarbides, carboxynitrides, and carbonitrides.

The ceramic powder used to form the composite material may contain a metal chemically bonded to the boron, oxygen, carbon, nitrogen, or silicon of the ceramic. The bonded metal may be selected from the group consisting of boron (bonded to a different metal), silicon (bonded to a different metal), magnesium, aluminum, titanium, vanadium, chromium, iron, copper, nickel, cobalt, tantalum, tungsten, molybdenum, zirconium, niobium, and alloys thereof.

Specific examples of combinations of ceramic and metal for forming the multi-phase ceramic-metal composite material include: $B_4C$/Al, SiC/Al, AlN/Al, $TiB_2$/Al, $Al_2O_3$/Al, $SiB_x$/Al, $Si_3N_4$/Al, SiC/Mg, SiC/Mg—Al, $Al_2O_3$/Mg, TiN/Al, TiC/Al, $ZrB_2$/Al, ZrC/Al, $AlB_{12}$/Al, $AlB_2$/Al, $AlB_{24}C_4$/Al, SiC/Ti, $SiB_6$/Ti, $B_4C$/Ni, $B_4C$/Ti, $B_4C$/Cu, $Al_2O_3$/Ti, $Al_2O_3$/Mo, SiC/Mo, $AlB_{12}$/Ti, $AlB_{24}C_4$/Ti, $Al_{3-4}BC$/Al, TiN/Ti, TiC/Ti, $ZrO_2$/Ti, $TiB_2/B_4C$/Al, $SiC/TiB_2$/Al, SiC/$Al_2O_3$/Al, TiC/Mo/Co, $ZrC/ZrB_2$/Zr, $TiB_2$/Ni, $TiB_2$/Cu, TiC/Mo/Ni, $TiB_2$/TiC/Al, $TiB_2$/TiC/Ti, and TiN/Ti. The use of the subscript "x" represents that the compound can have a varying stoichiometry.

Preferably, the multi-phase ceramic-metal composite material includes at least one boron-containing phase, at least one carbon-containing phase, and at least one aluminum-containing phase, wherein the phases may be admixed with a filler ceramic selected from the group consisting of borides, carbides, nitrides, oxides, silicides, and mixtures and combinations thereof. The filler ceramic is preferably employed in an amount from about 1 to about 50 volume percent based on the volume of the multi-phase ceramic-based material. This type of multi-phase ceramic-based material can fall under either the category of ceramic-ceramic composite materials or ceramic-metal composite materials. Particular phases of some specific examples of such multi-phase ceramic-based materials may include: $B_4C/AlB_{24}C_4/Al_4BC$, $TiB_2/AlB_{24}C_4/Al$, $ZrC/ZrB/Al$, $TiB_2/B_4C/Al$, $AlB_{24}C_4/AlB_{12}/Al_4BC$, $AlB_{12}/Al_4B_{1-3}C_4/Al$, and $AlB_{24}C_4/AlB_{12}/Al/SiB_x$. Again, the use of the subscript "x" represents that the compound can have a varying stoichiometry.

Most preferably, the multi-phase ceramic-based composite material forming the device is boron carbide-based, and it is even more preferred for the device to be made of an aluminum-boron-carbon (Al—B—C) composite material. This Al—B—C composite material has many properties which represent the desirable ceramic properties of low density and high stiffness and the desirable metal properties of high toughness, good electrical conductivity, and machinability. The boron carbide ceramic may be combined with any reactive metal to form a composite material, although aluminum or an aluminum alloy is the preferred metal because it is lightweight, thermally conductive, and highly reactive with the boron carbide ceramic.

The Al—B—C composite materials are ideal for use in forming computer devices because of the properties and the physical performance of the materials. For instance, the composite material advantageously has a density of less than about 3 g/cc, preferably, from about 2.58 to about 2.7 g/cc, an elastic modulus value of between about 220 and about 380 GPa, a flexure strength value of between about 450 and about 650 MPa, a fracture toughness value of between about 4 and about 12 MPa-$m^{1/2}$, a Vickers hardness value of about 700 to about 1700 Kg/$mm^2$ determined with a 30-pound load, an electrical resistivity value of less than $10^{-3}$ ohm-cm, preferably, between about $10^{-5}$ and $10^{-3}$ ohm-cm, a thermal conductivity of about 20 to about 40 W/m-°C. (as measured at 200° C.), a coefficient of thermal expansion from about $5.3\times10^{-6}$ to about $7.1\times10^{-6}$/°C., and the ability to be finished to a surface roughness required by each application. Some applications require a surface roughness of less than about 30 Angstroms, and some applications require a surface roughness of less than about 20 Angstroms. In addition, the Al—B—C composite material preferably experiences less than about a 2% dimensional change upon densification.

Other key properties of the preferred Al—B—C composite material are its specific stiffness and its coefficient of thermal expansion. Specific stiffness is the property of a material which quantifies the resistance to deflection by inertial loads generated by accelerations and decelerations. Specific stiffness is defined to be the modulus of elasticity of a material under tension divided by the density of the material. The specific stiffness of the Al—B—C composite material can be greater than $5.1\times10^5$ m and preferably greater than about $8.3\times10^6$ m, preferably up to or greater than about $14.3\times10^6$ m wherein the specific resistance has been normalized by the acceleration due to gravity (9.8 m/$s^2$).

In addition, the preferred Al—B—C composite material has a coefficient of thermal expansion which is close to that of alumina. Therefore, if some computer components are formed of alumina and some of the Al—B—C composite material, the two materials will expand at approximately the same amount when exposed to the heat generated during use.

Furthermore, the Al—B—C composite material is an unexpectedly good candidate material for hard disk drive components, as the properties of the composite material are superior to the materials that are currently used for these devices today. Table 1 compares various physical properties of the Al—B—C composite material to materials commonly used for computer components today.

TABLE 1

| Material | Density (g/cc) | Modulus (GPa) | Specific Stiffness (m) |
| --- | --- | --- | --- |
| Aluminum (3003 alloy) | 2.73 | 69 | $2.58 \times 10^6$ |
| Magnesium (AZ31B alloy) | 1.77 | 45 | $2.59 \times 10^6$ |
| Stainless Steel (304) | 8.02 | 193 | $2.45 \times 10^6$ |
| $Al_2O_3$ | 3.95 | 380 | $9.8 \times 10^6$ |
| SiC | 3.17 | 414 | $13.3 \times 10^6$ |
| Al—B—C composite | $</=2.7$ | 220–380 | $>8.3$ to $>14.3 \times 10^6$ |

When utilizing aluminum in a boron carbide ceramic, the material typically includes the phases of $B_4C$, $AlB_{24}C_4$, $Al_{3-4}BC$, $AlB_2$, $AlB_{12}$, $AlB_{12}C_2$, $Al_4B_{1-3}C_4$ and free metal Al. The preferred material has from about 4 to about 30 volume %, more preferably from about 4 to about 15 volume %, residual free metal. Desirably, the free metal is present only in the interstices, i.e., the interfaces between ceramic grains should be free of free metal. The preferred material is a multi-phase material made of aluminum, $B_4C$ grains and at least three other ceramic phases, preferably, $AlB_{24}C_4$, $Al_{3-4}BC$, and $AlB_2$. The $B_4C$ grains are preferably less than about 10 micrometers and are desirably surrounded by Al—B and Al—B—C phases. In other words, the composite material has a continuous ceramic network of Al—B and Al—B—C phases. This specific combination of phases in a boron carbide ceramic-based material exhibits a micro hardness gradient from about 19 to about 3200 Kg/mm². The free metal aluminum has a micro hardness of 19 Kg/mm², while the hardness of $B_4C$ is from about 2750 to 3200 Kg/mm². $AlB_{12}$ has a micro hardness of about 2600 Kg/mm², while $AlB_{24}C_4$ has a value of 2530 to 2650 Kg/mm². The micro hardness of $Al_{3-4}BC$ is around 1300–1400 Kg/mm², while that of $AlB_2$ is around 980 Kg/mm². Of course, other metals may be utilized, and due to different reactivity parameters, the above-described properties would be different.

A unique characteristic of the Al—B—C composite material is its tailorability. The chemistry, microstructure and properties of Al—B—C composite material can be altered by changing the processing conditions which allows for the optimization of the material for specific applications. For example, for bearings, the most important properties include microstructural uniformity, hardness, wear resistance, and surface finish. For load beams, support arms, and actuators, surface finish, wear resistance, and hardness are not as critical, but specific stiffness and toughness are more critical. For sliders, on the other hand, electrical conductivity and wear resistance are the most critical properties. Al—B—C composite materials can meet all of these requirements by altering the processing conditions used for forming the material.

The composite material should include relatively hard and soft phases, wherein the harder phases are preferably uniformly dispersed within the softer phases. If non-homogeneity is desired (for example, harder surfaces are desirable in wear applications), the harder materials could be concentrated in one particular location while the softer phases could be concentrated in another. For most of the present applications of computer components, it is presently desired to have uniform surface properties, although it is foreseen that possibly certain areas of the component may be desired to be harder and smoother than others. It is desirable that the harder phases are present in an amount from about 30 to about 80 volume %, more desirably, from about 40 to about 60 volume %, based on the total volume of the material. The softer phases should have hardnesses which are from about 25 to about 75%, more preferably, from about 50 to about 75%, lower than the harder phases. It is also preferred that at least 50% of the ceramic interfaces between the harder and softer phases are substantially metal free.

Method of making Components

One way of making the components formed of the multi-phase ceramic-based material is by blending together appropriate powders, forming a preform of the blended powders, and pressureless or pressure sintering the preform. Appropriate powder mixtures may be, e.g., ceramic/ceramic powder mixtures or ceramic/metal powder mixtures. The blending of the powders may be done by any conventional technique, such as dry milling or wet milling. Forming the preform of the blended powders may be done by conventional techniques such as tape casting, extruding, injection molding, die pressing, role compacting, compression molding, and slip casting. To form the preform, binders may be added to the blended powders before forming the preform. If a binder is used, it may be desirable to perform debindering operations, e.g., heating the preform in an inert atmosphere to a temperature which burns off the binder.

The preform may then be sintered to a density of greater than 98% theoretical density, more preferably, greater than 99.5% theoretical density.

After sintering, the densified body may be machined to the final shape and/or polished with polishing media. In addition, the densified body may be coated on its surface to improve its smoothness or provide other desired characteristics. The material coated thereon may be any suitable metal (e.g., chromium, nickel, cobalt, silicon, aluminum, copper, titanium, or magnesium), metal alloy, metal oxide, metal nitride, metal carbide, glass, ceramic, polymeric materials, and combinations thereof. The coating method may be any that provides dense coatings, e.g., atomic deposition, particulate deposition, bulk coating, or surface modification. The coating itself may be further treated to provide a textured surface either over the entire surface or a portion of the surface. The further treatment may be accomplished by techniques, such as, mechanical techniques, chemical techniques, electrical techniques, or a combination thereof. These techniques are known in the art.

Another possible method of forming the multi-phase ceramic-based material includes the steps of forming a porous body of ceramic and thereafter infiltrating the ceramic with a liquid, which may include a liquid metal, or molten glass (as the second ceramic material) to form the computer component. Forming the porous body can be accomplished by tape casting ceramic powder, where the powder has a grain size of from about 0.1 to about 100 micrometers, although the preferred powder size has a mean diameter grain size of less than about 10 micrometers and, more preferably, less than about 3 micrometers. It is desirable, for packing purposes, that within these ranges, the powdered ceramics have a broad particle size distribution. In addition to tape casting, the porous body may also be formed by extruding, injection molding, die pressing, role compacting, compression molding, and slip casting. The porous body preferably has a porosity of from about 10 to about 75%, more preferably, from about 25 to about 50%, and, most preferably, from about 25 to about 35%. To form the porous bodies, binders may be added to the ceramic powder before forming the porous body. If a binder is used, it may be desirable to perform debindering operations, e.g., heating the porous body in an inert atmosphere to a temperature which burns off the binder.

The speed of the reaction (i.e., reaction kinetics) affects the phases and morphology in the material and is controlled to make the desired material. For example, when a boron carbide is the precursor ceramic material, it is especially advantageous if there is an increased amount of carbon within the carbide structure to reduce reactivity of the carbide and increase the number of phases within the product under more controlled circumstances. Although there may be a similar number of phases without such control, it is much easier to know which phases are present if it is controlled by lessening the reactivity of the carbide precursor material.

Another way of achieving some control over the phases and morphology of the material is by including a step of passivating the porous body of, e.g., boron carbide ceramic, by elevating it to a temperature of about 1300° to about 1800° C. before the infiltration step, such that the surfaces are passivated and the reaction kinetics can be better controlled during the infiltration step. This step of passivating is preferably accomplished at a temperature of between about 1400° to about 1450° C. The passivating step can take place in nitrogen, argon, or any other gas, but is preferably accomplished under an argon blanket for a period of time from about 1 minute to about 20 hours. The thickness of the porous body will greatly determine how long this passivating step should be in order to receive benefits throughout the bulk of the porous body material.

After the passivating step, the step of infiltrating may be accomplished by heat (melt) infiltrating, vacuum infiltrating, pressure infiltrating, gravity/heat infiltrating, and other known methods. The method will generally depend upon which liquid is being used. Possible liquids include molten metal, molten glass, liquid polymers (including conductive polymers) that will harden upon solidification or curing, depending upon the liquid being used. Any liquid that will densify the ceramic may be used. The most preferred liquid is molten metal, although molten glassy materials may be used with great success. Also envisioned is the use of various polymers, epoxies, and other organic liquids that will harden.

During infiltration, the liquid may or may not react with the ceramic body. The step of infiltrating may be accomplished by sandwiching the porous body ceramic between two pieces of metallic foil and thereafter heating to a sufficient temperature to melt the metallic foil and thereby infiltrate the porous body with the metal. The melting point of the metal of the metallic foil will dictate the temperature at which the infiltration should be performed. For instance, if aluminum or aluminum alloy is used, pressureless infiltration can be accomplished at a temperature of from about 700° C. to about 1200° C., but preferably from about 900° C. to about 1200° C. The infiltration can be conducted in vacuum, at atmospheric pressure, or under pressure. The selection of the pressure of infiltration depends on the wetting characteristics of the infiltrating liquid and the porous ceramic.

Furthermore, infiltration can be accomplished in inert gas (such as argon). When pressure is applied, the infiltration temperature can be lowered. One of ordinary skill in the art will know many different ways of melting metal or glass and incorporating them into the pores of a porous ceramic. The preferred metal to be used is aluminum, and it is especially preferred to sandwich boron carbide between two pieces of aluminum foil and heat the structure such that the aluminum is integrated into the porous boron carbide.

During metal infiltration of the porous body of ceramic, the porous body may be placed between refractory plates to help maintain the shape of the porous body, if desired. For example, a porous body of ceramic may be first sandwiched between foils of aluminum. Then, aluminum nitride substrates coated with aluminum nitride powder may be placed on the outer sides of the aluminum foils. Therefore, the stack, from top to bottom, would consist of an aluminum nitride substrate, aluminum nitride powder, aluminum foil, the porous body of ceramic, aluminum foil, aluminum nitride powder, and an aluminum nitride substrate. Aluminum nitride was the chosen material for the refractory substrates and the powder, as aluminum nitride is not generally wettable by molten aluminum, and the aluminum, thus, would infiltrate only the porous body of ceramic.

The infiltration is performed until the infiltrated ceramic body is substantially dense, thereby densifying the ceramic body to greater than 98% theoretical density, more typically, greater than 99.5% theoretical density. The ceramic body typically undergoes less than about a 2% linear shrinkage upon densification.

Variation in the stiffness of a multi-phase ceramic-metal composite material may be achieved without significant changes in density by manipulation of the level of ceramic used and/or leaving larger amounts of unreacted metal within the ceramic grains.

An additional step of heat treatment after the infiltrating step may help the multi-phase ceramic-based material to become more uniform. The heat treatment may be conducted immediately after infiltration, or, alternatively, the infiltrated body may be cooled to a temperature below the heat treatment temperature (e.g., ambient temperature) and, subsequently, heat treated. In the case of Al—B—C composite material, this additional step of heat treating is preferably accomplished by heating the infiltrated body to a temperature of from about 625° to about a 1000° C., more preferably from about 625° C. to about 900° C., for a period of time of between about 1 to about 50 hours, and most preferably for a time period of between about 25 and 50 hours. The most preferred heat treatment temperature is 700° C. The heat treatment may be performed in, e.g., air, nitrogen, or argon. It is during this heat treatment that the greatest control over the formation of multi-phases is achieved. The heat treatment can be for a long period of time at a low temperature or it may be for a shorter period of time at a higher temperature.

After the infiltration step, the infiltrated body is cooled to allow the liquid infiltrant to solidify. The infiltrated body may then be polished with polishing media and/or machined to the final shape, if necessary or desired. Certain of the computer components can be cast into a sufficiently precise near net shape such that machining may not be necessary.

In addition, the infiltrated body may be coated on its surface to improve its smoothness or provide other desired characteristics. The material coated thereon may be metal (e.g., chromium, nickel, cobalt, silicon, aluminum, copper, titanium, or magnesium), metal alloy, metal oxide, metal nitride, metal carbide, glass, ceramic, polymeric materials, and combinations thereof. The coating method may be any that provides dense coatings, e.g., atomic deposition, particulate deposition, bulk coating, or surface modification. When the ceramic-based material is boron-carbide-based and the coating is a nickel-containing layer, a transition zone is created between the boron-carbide-based material and the nickel-containing layer which contains boron carbide and nickel. Typically, this transition zone is from about 1 to about 10 micrometers thick and, more typically, from about 1 to about 5 micrometers thick, depending on coating conditions.

The coating itself may be further treated to provide a textured surface either over the entire surface or a portion of the surface. Further treatment of the coating may be accomplished by techniques, such as, mechanical techniques, chemical techniques, electrical techniques, or a combination thereof, known in the art.

Accordingly, the present invention provides hard disk drive components and methods of making same, wherein the components are formed of a material having high hardness, high wear resistance, high fracture toughness, high damping capability, low density, and high specific stiffness while being electrically conductive. In addition, the material forming the components exhibits unique combinations of properties, such as high stiffness and high toughness, high hardness and high strength, and high stiffness and high damping capability. The present invention also provides hard disk drive components and methods of making same, wherein the components are formed of a material that undergoes a low amount of shrinkage upon densification. Furthermore, the various components of the present invention may be formed of the same material which improves the dimensional stability of the computer and the precision of data acquisition.

The following examples are illustrative only and should not be construed as limiting the invention which is properly delineated in the appended claims.

EXAMPLES

Example 1

A fully-dispersed aqueous suspension of boron carbide powders was prepared. In order to make the best use of powder loading, a mixture of 30% ESK 1500 $B_4C$ and 70% ESK 5 μm and finer $B_4C$ was used (ESK specification 1500, manufactured by Elektroschemeltzwerk Kempten of Munich, Germany, and having an average particulate size of 3 μm). These powders were washed with methanol prior to the suspension preparation. The powder mixture was then dispersed in water at a powder loading of 55 volume %, based on the total volume of the suspension, at a pH of 7. In addition, ultrasonication was applied repeatedly in order to facilitate the break-up of soft agglomerates. Once the suspension was prepared, hard aggregates and foreign debris were then removed by screening the suspension using a 635 mesh filter. After screening, the suspension was degassed in order to eliminate trapped air bubbles. These trapped air bubbles not only lead to voids in tapes, which might not be filled completely during infiltration of molten Al, but they may also lead to fine cracks during drying.

After the suspension was prepared, 7–10% of the latex binder "Rhoplex" HA-8, sold under the trademark owned by Rohm & Haas of Cambridge, Mass., was added. One advantage of using this particular latex over other such latexes was that the dispersant included in this latex enhanced the wetting of the aqueous suspension on the hydrophobic Mylar film on which the suspension was being cast into tapes. Consequently, no other wetting agent was necessary. When the latex binder was then added to the suspension, care was taken not to introduce any air bubbles.

The resulting boron carbide suspension and latex binder mixture was cast into a multitude of thicknesses of tapes on oriented polypropylene film (Mylar D film) using a doctor blade moving at 1.8 cm/sec. After casting, the tapes were dried in an ambient environment without using any type of special apparatus. Tapes of up to 20 mils (500 micrometer) thick could be dried without cracking. A drying time range of from 10 min. to 12 hours was needed depending upon the thickness of the tapes. After the drying process was completed, the tapes were then peeled off the Mylar film and cut to their desired size. These tapes could also be stacked one on top of the other as well as being adhered together by pressing uniaxially at ambient temperatures.

After tape casting, the tapes were debindered in a reasonably short time without any cracking or warping. Both laminated and single tapes of various thicknesses were placed between refractory plates and then heated to 500° C. at about 100° C./h, held for 2 hours at 500° C. and cooled at 100° C./h to ambient temperature in flowing nitrogen. The resulting debindered tapes were flat and free of cracks. The porosity of the debindered tapes was about 42% based on the total tape volume.

For one debindered tape, enough aluminum foil to completely infiltrate the tape was equally divided into two stacks and the stacks were placed on opposite sides of the tape. An aluminum nitride block coated on one side with aluminum nitride powder was placed on each side of the aluminum foil forming a stacked assembly. The aluminum nitride block was placed so that the aluminum nitride powder-coated side faced the aluminum foil. The stacked assembly was heated to and maintained at 1100° C. for two hours in vacuum, thus allowing the aluminum to infiltrate into the pores of the debindered tape and creating an Al—B—C composite. The aluminum-infiltrated tape was then cooled and separated from the aluminum nitride-coated aluminum nitride blocks and ground to about 0.307 mm thick and cut into the shape of a support arm for a hard disk drive.

Example 2

A bimodal $B_4C$ powder mixture was prepared by first washing ESK-5 micrometer $B_4C$ powder and ESK 1500 $B_4C$ powder in methanol for 1 hour and, then, blending together a 70:30 weight ratio of ESK-5 micrometer to ESK 1500. A 55 volume % slip was prepared from the $B_4C$ powder mixture and HPLC-grade water. Powder agglomerates were broken by rolling the slip with $B_4C$ milling media, screening the rolled slip through a 170 mesh screen, and rolling the slip again without milling media, followed by degassing the slip. Plaster molds having a 55% porosity were prepared for casting 4.5"×4.5"×0.7" rectangular plates. The slip was then poured into the plaster molds and allowed to dry. The dried casted $B_4C$ had a density of about 72.2% theoretical. The green plates were baked at 1425° C. for 2 hours and then infiltrated with aluminum alloy 1350° at 1160° C. for 1.5 hours in vacuum. The metal-infiltrated plates were then heat-treated at 690° C. for 25 hours in air. The plates were then cooled and ground into the shape of a support arm for a hard disk drive. Example 3

A 50 volume percent $B_4C$ powder/50 volume percent binder mixture was prepared by blending together ESK 1500 $B_4C$ powder and a thermoplastic binder system. Stearic acid was added as a dispersant to the mixture at a level of about 5 weight percent based on the weight of the $B_4C$ powder. The mixture was mixed at 130° C. and injection molded into parts having a volume of about 8.6 $cm^3$ at an approximate molding temperature of 112° C., and an injection rate of about 60 $cm^3$/second. Some of the parts were debindered by first immersing them in a heptane bath for 11 hours at 23° C. and, thereafter, dried in air for several days. The dried parts were then subjected to a thermal binder burnout procedure which consisted of heating the parts to 370° C. at a rate of 25° C./hour, then to 500° C. at a rate of 10° C./hour, and then to 565° C. at a rate of 22° C./hour, all heating being performed in a nitrogen atmosphere. The debindered parts were then infiltrated with aluminum at 1160° C. for five hours to form Al—B—C parts. The average difference for a characteristic dimensional measure between the green and the infiltrated states was about 0.002 inches for a 1.473 inch length. This example demonstrates the applicability of using injection molding to form Al—B—C parts requiring accurate final geometries with minimal final machining required.

Example 4

Four green boron carbide tapes were laminated by pressing them together in a cold isostatic press at 30,000 psi pressure. The laminate was then debindered and sandwiched between two aluminum sheets. The sandwiched structure was heated to 1000° C. in vacuum to allow molten aluminum to wick into the porous boron carbide. A functional laminate was produced by this method. The laminate had a thickness of 45 mils (1125 micrometers). Next, excess aluminum, which was on the surface of the boron carbide laminate, was removed by sanding with 220 grit SiC paper. The laminate was then ground to about 1600–2000 Angstroms roughness, cleaned in acetone for one minute, and cleaned in methanol for one minute. The laminate surface was then zincated by immersing the laminate in a solution containing 100 grams ZnO, 525 grams NaOH, and 1 liter of HPLC-grade water. After the zincation, the laminate was rinsed under running water for 1 minute. The laminate was then submersed in "Niculoy" 22 Solution, a nickel-containing solution produced by Shipley Company, Inc., for one hour. The temperature of the "Niculoy" 22 Solution was 85° C. After the submersion in the "Niculoy" Solution, the laminate was again rinsed under running water for 1 minute. The resulting laminate had a dense nickel coating having an average thickness of 16–18 micrometers. A cross-section of the nickel-plated laminate indicated a unique formation of a $B_4C$-Ni transition zone between the nickel plating and the Al—B—C composite material.

Example 5

An Al—B—C tape was ground and lapped to a surface finish of about 180 Angstroms. The ground and lapped tape was then electroplated with copper using a water-based electroplating solution maintained at 20° C. and containing $CuSO_4$ at a level of 188 grams/liter of solution, $H_2SO_4$ at a level of 74 grams/liter of solution, and wood glue at a level of 1 drop/500 ml solution. The electroplating was conducted using a voltage of 1 volt and a current of 0.6 to 0.8 Amp. After 3 minutes of electroplating, the copper plating was uniform and adhered well to the Al—B—C tape.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A hard disk drive component having a magnetic media deposited thereon comprising a non-disk device formed of a multi-phase ceramic-metal composite having a crystalline ceramic phase and a free metal phase wherein the theoretical density of the hard disk drive component is greater than 98 percent.

2. The component of claim 1, wherein the device is a slider, load beam, support arm, actuator, actuator bearing, spacer, clamp, spindle, ball bearing, thrust bearing, journal bearing, base plate, housing, or cover.

3. The component of claim 1, further comprising a coating on a surface of the device, the coating being selected from this group consisting of metal, metal alloy, metal oxide, metal nitride, metal carbide, glass, ceramic, polymeric materials, and combinations thereof.

4. The component of claim 1, wherein the ceramic-metal composite material is formed from a combination of a ceramic and a metal, the metal being selected from the group consisting of silicon, magnesium, aluminum, titanium, vanadium, chromium, iron, copper, nickel, cobalt, tantalum, tungsten, molybdenum, zirconium, niobium, and mixtures and alloys thereof, and the ceramic being selected from the group consisting of borides, oxides, carbides, nitrides, silicides, and mixtures and combinations thereof.

5. The component of claim 1, wherein the ceramic-metal composite material includes boron carbide ceramics.

6. The component of claim 1, wherein the ceramic-metal composite material includes the phases, $B_4C$, Al, $AlB_{24}C_4$, $Al_{3-4}BC$, and $AlB_2$.

7. The component of claim 1, wherein the ceramic-metal composite material includes aluminum-boron-carbon-materials and the component further comprises a nickel-containing layer on a surface of the device and a transition zone containing boron carbide and nickel between the aluminum-boron-carbon-based material and the nickel-containing layer.

8. The component of claim 1, wherein the ceramic-metal composite material includes aluminum-boron-carbon-based materials.

9. The component of claim 8, wherein the ceramic-metal composite material has a specific stiffness of greater than about $5.1 \times 10^6$ m and a density of less than about 3 grams per cubic centimeter.

10. The component of claim 8, wherein the ceramic-metal composite material has an electrical resistivity of less than about $10^{-3}$ ohm-cm.

11. A hard disk drive component, comprising a device selected from the group consisting of sliders, load beams, support arms, actuators, actuator bearings, spacers, clamps, spindles, ball bearings, thrust bearings, journal bearings, base plates, housings, and covers, the device formed of an aluminum-boron-carbon-based material having the phases, $B_4C$, Al, $AlB_{24}C_4$, $Al_{3-4}BC$, and $AlB2$, the material having a specific stiffness of greater than about $5.1 \times 10^6$ m, a density of less than about 3 grams per cubic centimeter, and an electrical resistivity of less than about $10^{-3}$ ohm-cm.

12. The component of claim 4 wherein the ceramic-metal composite material is aluminum-boron-carbide or aluminum-silicon-carbide.

13. A hard disk drive component comprising a non-disk device formed of a multi-phase aluminum-boron-carbide composite material having at least one phase being boron-carbide and at least one phase being free aluminum wherein the theoretical density of the hard disk drive component is greater than 98 percent.

14. The component of claim 13 wherein the ceramic-metal composite material comprises an aluminum-boron-carbide composite material containing $B_4C$, Al, $AlB_{24}C_4$, $Al_{3-4}BC$, and $AlB_2$.

15. The component of claim 14 wherein the component contains a nickel-containing layer on one or more surfaces of the component.

* * * * *

UNITED STATES PATENT AND TRADEMARK OFFICE
CERTIFICATE OF CORRECTION

PATENT NO. : 5,672,435
DATED : September 30, 1997
INVENTOR(S) : David W. Born, et al.

It is certified that error appears in the above-indentified patent and that said Letters Patent is hereby corrected as shown below:

Page 1, column 1, under References Cited, Inventor for US Patent 4,702,770, delete "Ryzik", and insert therefore –Pyzik--.

Page 1, column 1, under References Cited, Inventor for US Patent 4,961,778, delete "Ryzik", and insert therefore –Pyzik--.

Page 1, column 2, Inventor for US Patent 5,039,633, delete "Ryzik", and insert therefore --Pyzik--.

Column 13, Claim 1, line1, after "component", delete the phrase "having a magnetic media deposited thereon".

Column 13, Claim 1 line 6, after "percent", insert the phrase –and the specific stiffness is greater than about $5.1 \times 10^6$ m --.

Column 14, Claim 3, line 4, delete "glass".

Column 14, Claim 11, line 7, delete "A1B2", insert therefore –$AlB_2$--.

UNITED STATES PATENT AND TRADEMARK OFFICE
CERTIFICATE OF CORRECTION

PATENT NO.  : 5,672,435
DATED       : September 30, 1997
INVENTOR(S) : David W. Born, et al.

It is certified that error appears in the above-indentified patent and that said Letters Patent is hereby corrected as shown below:

Column 14, Claim 11, line 8, delete "$5.1 \times 10^6$ m", and insert therefore --$5.1 \times 10^6$ m--.

Signed and Sealed this

Eighteenth Day of August, 1998

Attest:

BRUCE LEHMAN

Attesting Officer    Commissioner of Patents and Trademarks